United States Patent
Chou et al.

(10) Patent No.: US 7,251,166 B2
(45) Date of Patent: Jul. 31, 2007

(54) METHOD FOR VERIFYING A PROGRAMMED FLASH MEMORY

(75) Inventors: Ming-Hung Chou, Hsinchu (TW); Hsin-Yi Ho, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 478 days.

(21) Appl. No.: 10/962,588

(22) Filed: Oct. 13, 2004

(65) Prior Publication Data

US 2005/0149664 A1 Jul. 7, 2005

(30) Foreign Application Priority Data

Jan. 6, 2004 (TW) .............................. 93100302 A
Jan. 15, 2004 (CN) ....................... 2004 1 0002265

(51) Int. Cl.
*G11C 11/34* (2006.01)
(52) U.S. Cl. .............................. 365/185.22; 365/185.24
(58) Field of Classification Search ........... 365/185.22, 365/185.24
See application file for complete search history.

(56) References Cited

U.S. PATENT DOCUMENTS

| 2003/0200406 | A1* | 10/2003 | Kouno ....................... 711/164 |
| 2004/0090824 | A1* | 5/2004 | Takano et al. ........... 365/185.2 |
| 2004/0184317 | A1* | 9/2004 | Miwa et al. ........... 365/185.03 |
| 2004/0246784 | A1* | 12/2004 | Yamada ................. 365/189.07 |
| 2004/0257880 | A1* | 12/2004 | Yeh et al. .............. 365/185.29 |
| 2005/0057972 | A1* | 3/2005 | Taito et al. ........... 365/185.28 |
| 2005/0265081 | A1* | 12/2005 | Tran et al. ............. 365/185.29 |

* cited by examiner

*Primary Examiner*—Michael Tran
(74) *Attorney, Agent, or Firm*—Rabin & Berdo, P.C.

(57) ABSTRACT

A method for verifying a programmed flash memory. When reading a memory cell, a voltage applied to a drain of the memory cell is a read drain voltage. First, a word line is enabled by applying a verification gate voltage. Next, a first bit line, which is connected to the drain of the memory cell, is enabled and a verification drain voltage, which is higher than the read drain voltage, is applied to the first bit line. Then, a second bit line is enabled and grounded. Thereafter, a third bit line is enabled and a verification isolation voltage is applied. Then, a drain current of the first bit line is sensed, wherein the drain current flows through the first bit line, the memory cell, and the second bit line. Finally, it is judged whether or not the memory cell is successfully programmed according to the drain current.

6 Claims, 3 Drawing Sheets

|  | Vd | Vg | Viso |
|---|---|---|---|
| Progam verification | 2.5 | 4.2 | 2.5 |
| Read | 1.6 | 3 | 1.6 |

|  | Vd | Vg | Viso |
|---|---|---|---|
| Progam verification | 1.6 | 4.2 | 1.6 |
| Read | 1.6 | 3 | 1.6 |

| | Vd | Vg | Viso |
|---|---|---|---|
| Progam verification | 2.5 | 4.2 | 2.5 |
| Read | 1.6 | 3 | 1.6 |

METHOD FOR VERIFYING A PROGRAMMED FLASH MEMORY

This application claims the benefit of Taiwan application Serial No. 93100302, filed Jan. 06, 2004, the subject matter of which is incorporated herein by reference.

BACKGROUND OF THE INVENTION

1. Field of the Invention

The invention relates to a program verifying method, and more particularly to a method for verifying a programmed flash memory.

2. Description of the Related Art

Various electric products need memories for the purposes of storing data or serving as operation buffers. The memories include a random access memory (RAM), a read only memory (ROM), a flash memory, and the like. Data may be conveniently and quickly read from or written into the RAM, but the data will be lost when the power supply is off. So, the RAM is suitable for the purpose of temporarily storing data or serving as an operation buffer. Data has been programmed in the ROM in advance before the ROM is shipped, and data cannot be lost and amended, so the ROM is suitable for the data storage without modifications. Data may be read from or written into the flash memory and the data stored therein can be kept without any power, so the flash memory is suitable for various purposes of data storage.

FIG. 1 is an equivalent circuit diagram showing a flash memory with a virtual ground memory array. The flash memory 100 includes a plurality of memory cells M arranged in an array. Each memory cell M is enabled by its corresponding word line WL. When the flash memory is read or programmed, the corresponding bit line BL and word line WL are enabled according to the memory cell M to be operated. Whether the bit line BL is electrically connected to sense amplifier or grounded is determined through a selection switch, wherein the selection switch and the sense amplifier are not depicted in the drawing.

In the flash memory, the stored content of each memory cell M is determined according to the threshold voltage Vt. FIG. 2 is a graph showing threshold voltage distributions of a memory cell. If the stored content of the memory cell is 0, the memory cell is in the high-threshold distribution region HVt. That is, the threshold voltage thereof has to be greater than the high threshold voltage Vth. If the stored content of the memory cell is 1, the memory cell is in the low-threshold distribution region LVt. That is, the threshold voltage thereof has to be smaller than the low threshold voltage Vtl.

After the data has been written into the flash memory (i.e., after the flash memory has been programmed), it is necessary to perform a verification procedure in order to ensure the correctness of the written data. That is, it is verified that whether the threshold voltage of the memory cell is above Vth or below Vtl according to the stored value of the memory cell. The procedure of reading the memory cell is also similar to the verification procedure. FIG. 3 is an equivalent circuit diagram showing the condition when a memory cell M(k+1,i) is verified or read. The selected word line WLi is enabled, the bit line BL(k+1) is electrically connected to the sense amplifier, and the bit line BL(k+2) is grounded. The bit line BL(k) is electrically coupled to an isolation potential Viso. Ideally, the potential Vd of the bit line BL(k+1) is the same as the potential Viso of BL(k). In the practical application, however, the two voltages may be different owing to the circuit configuration or the manufacturing processes.

FIG. 4 is a schematic table showing values of the applied voltages during the verification and read procedures. When the reading procedure is performed, the voltage Vg of the word line WLi is set to be between the high threshold voltage Vth and the low threshold voltage Vtl, such as 3 volts. The drain voltage Vd of the memory cell M(k+1,i) is set to be 1.6 volts. The sense amplifier detects the drain current Id of the memory cell M(k+1,i) to verify the stored value of the memory cell M(k+1,i). If the drain current Id is high, it means that the memory cell M(k+1,i) is turned on and the stored value thereof is 1. If the drain current Id is 0, it means that the enabled word line WLi cannot turn on the memory cell M(k+1,i) and the stored value is 0.

After the memory cell is programmed and when the verification procedure is performed, the voltage Vg applied to the word line WLi is set to be 4.2 volts, and the drain voltage Vd of the memory cell M(k+1,i) is set to be 1.6 volts. The sense amplifier detects the drain current Id of the memory cell M(k+1,i) to verify the stored value of the memory cell M(k+1,i). If the drain current Id detected by the sense amplifier is 0, it means that the enabled word line WLi cannot turn on the memory cell M(k+1,i). So, the threshold voltage of the memory cell M(k+1,i) is greater than the voltage Vth, and the memory cell M(k+1,i) is in the high-threshold distribution region, which means that the written data is correct: otherwise, it means that the threshold voltage of the memory cell M(k+1,i) is not high enough, and the memory cell has to be re-programmed so that the data may be written thereto.

However, the leakage current existing in the verification procedure makes the verification result not precise enough. As shown in FIG. 3, the drain current Id actually includes the sum of the current Icl flowing through the memory cell M(k+1,i) and the leakage current Ileak. The leakage current Ileak is determined by the voltage of the word line WLi and the difference between the drain voltage Vd of the memory cell M(k+1,i) and the isolation voltage Viso. When the verification procedure is performed, the voltage of the word line WLi is higher. So, once the drain voltage Vd and the isolation voltage Viso are different, the generated leakage current is larger, and the verification precision will be influenced.

SUMMARY OF THE INVENTION

It is therefore an object of the invention to provide a method for verifying a flash memory.

The invention achieves the above-identified object by providing a method for verifying a programmed flash memory. When a memory cell of the flash memory is read, a voltage applied to a drain of the memory cell is a read drain voltage. First, a word line is enabled, and a verification gate voltage is applied. Next, a first bit line, which is electrically connected to the drain of the memory cell, is enabled and a verification drain voltage, which is higher than the read drain voltage, is applied to the first bit line. Then, a second bit line is enabled and grounded. Thereafter, a third bit line is enabled and a verification isolation voltage is applied. Then, a drain current of the first bit line is sensed, wherein the drain current flows through the first bit line, the memory cell, and the second bit line. Finally, it is judged whether or not the memory cell is successfully programmed according to the drain current.

Other objects, features, and advantages of the invention will become apparent from the following detailed description of the preferred but non-limiting embodiment. The following description is made with reference to the accompanying drawings.

DETAILED DESCRIPTION OF THE INVENTION

Figure 1:
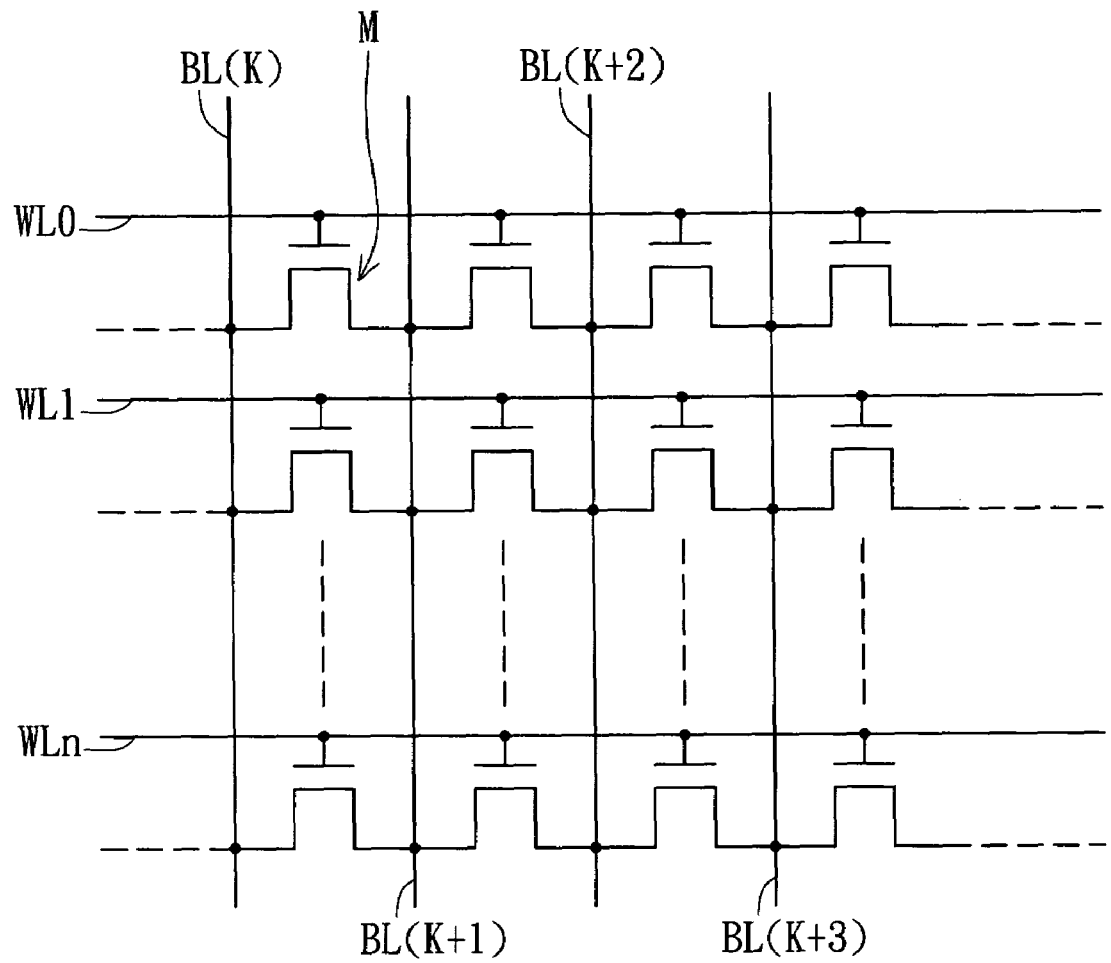
FIG. 1 is an equivalent circuit diagram showing a flash memory with a virtual ground memory array.
Figure 2:
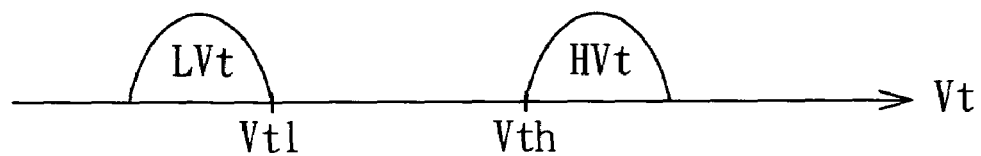
FIG. 2 is a graph showing threshold voltage distributions of a memory cell.
Figures 3, 4:
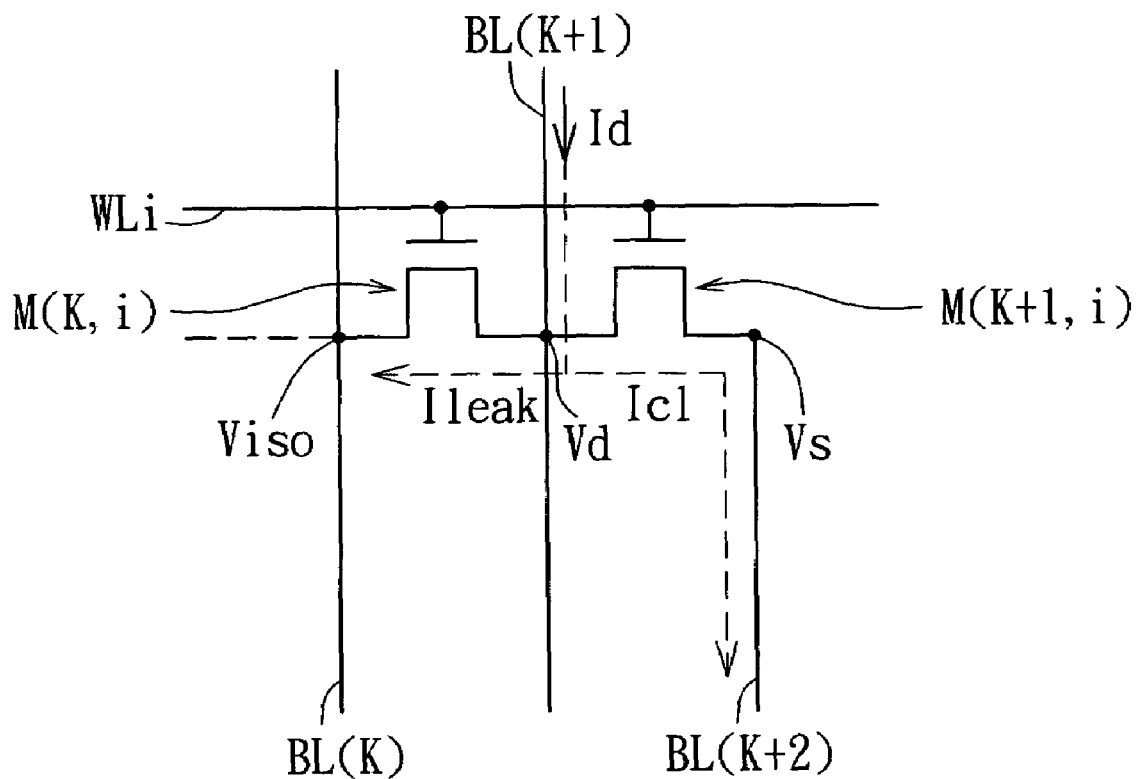
FIG. 3 is an equivalent circuit diagram showing the condition when a memory cell M(k+1,i) is verified or read.
FIG. 4 is a schematic table showing values of the applied voltages during the verification and read procedures.

After data has been written into the flash memory (i.e., after the flash memory has been programmed), it is necessary to perform a verification procedure in order to ensure the correctness of the written data. The procedure of reading the memory cell is also similar to the verification procedure. If it is known that "0" has been written into the memory cell M(k+1,i), the memory cell M(k+1,i) is programmed as the high-threshold distribution region. When the verification procedure is performed, as shown in FIG. 3, the voltage Vg applied to the word line WLi is set to be the high threshold voltage value Vth, such as 4.2 volts as shown in FIG. 4. The drain voltage Vd of the memory cell M(k+1,i) is set to be 1.6 volts. The sense amplifier detects the drain current Id of the memory cell M(k+1,i) to verify the stored value of the memory cell M(k+1,i). If the drain current Id detected by the sense amplifier is 0, it means that the enabled word line WLi cannot turn on the memory cell M(k+1,i). Thus, the threshold voltage of the memory cell M(k+1,i) is greater than the voltage Vth, and the memory cell M(k+1,i) is in the high-threshold distribution region, which means that the written data is correct; otherwise, it means that the threshold voltage of the memory cell M(k+1,i) is not high enough, and the memory cell has to be re-programmed so that the data may be written thereto.

However, the leakage current existing in the verification procedure makes the verification result not precise enough. As shown in FIG. 3, the drain current Id actually includes the sum of the current Icl flowing through the memory cell M(k+1,i) and the leakage current Ileak. The leakage current Ileak is determined by the voltage of the word line WLi and the difference between the drain voltage Vd of the memory cell M(k+1,i) and the isolation voltage Viso. When the verification procedure is performed, the voltage of the word line WLi is higher. So, the generated leakage current is larger, and the verification precision will be influenced.

Figures 5, 6:
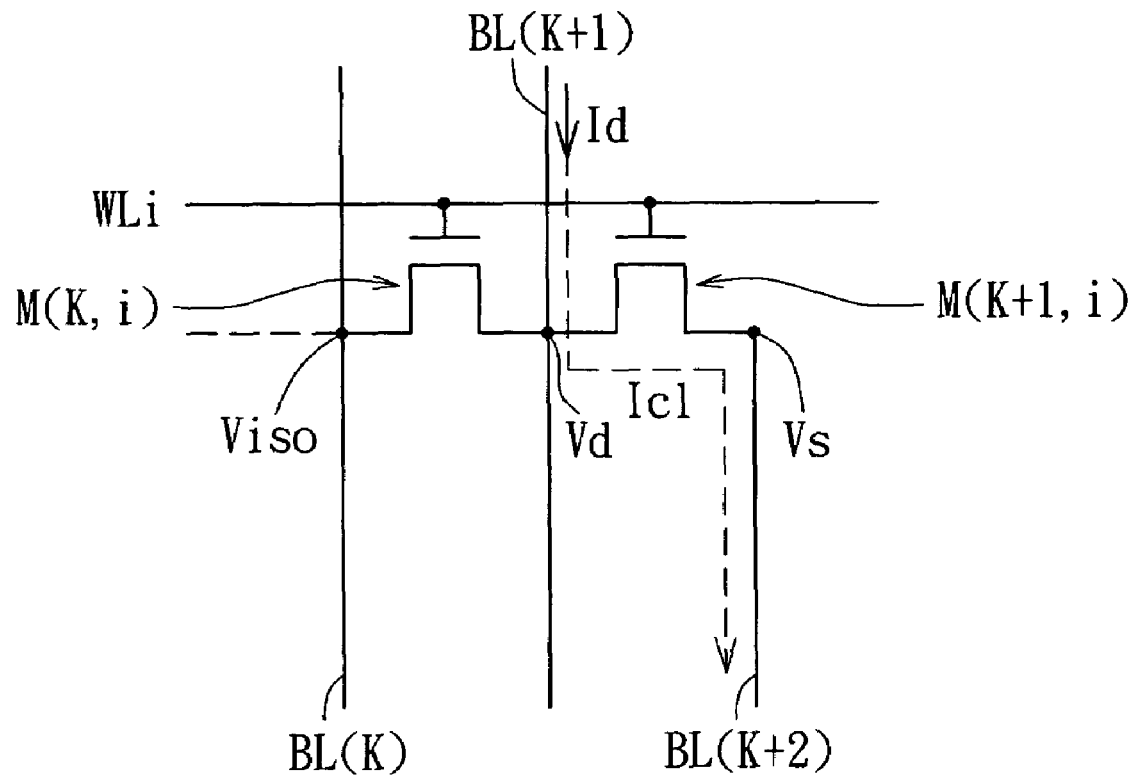
FIG. 5 is an equivalent circuit diagram showing a verification memory cell M(k+1,i) according to a preferred embodiment of the invention.
FIG. 6 is a schematic table showing values of the applied voltages during the verification and read procedures in the preferred embodiment of the invention.

FIG. 5 is an equivalent circuit diagram showing a verification memory cell M(k+1,i) according to a preferred embodiment of the invention. The selected word line WLi is enabled, the bit line BL(k+1) is electrically connected to a sense amplifier, and the bit line BL(k+2) is grounded. FIG. 6 is a schematic table showing values of the applied voltages during the verification and read procedures in the preferred embodiment of the invention. When the reading procedure is performed, the voltage Vg of the word line WLi is set to be between the high threshold voltage Vth and the low threshold voltage Vtl, such as 3 volts, and the drain voltage Vd of the memory cell M(k+1,i) is set to be 1.6 volts. The sense amplifier detects the drain current Id of the memory cell M(k+1,i) to verify the stored value of the memory cell M(k+1,i). If the drain current Id is high, it means that the memory cell M(k+1,i) is turned on, so the value stored therein is 1. If the drain current Id is 0, it means that the enabled word line WLi cannot turn on the memory cell M(k+1,i), so the value stored therein is 0.

After the memory cell is programmed and when the embodiment is utilized for verification, the voltage Vg applied to the word line WLi is set to be, for example, 4.2 volts, and the drain voltage Vd of the memory cell M(k+1,i) is set to be 2.5 volts according to this embodiment. The isolation voltage Viso is set to be 2.4 volts, which is the worst case that might be caused. Ideally, the drain voltage Vd and the isolation voltage Viso are the same. The sense amplifier detects the drain current Id of the memory cell M(k+1,i) to verify the stored value of the memory cell M(k+1,i). If the drain current Id detected by the sense amplifier is 0, it means that the enabled word line WLi cannot turn on the memory cell M(k+1,i). So, the threshold voltage of memory cell M(k+1,i) is higher than the voltage Vth, and the memory cell M(k+1,i) is in the high-threshold distribution region, which means that the written data is correct; otherwise, it means that the threshold voltage of the memory cell M(k+1,i) is not high enough, and the memory cell has to be re-programmed so that the data may be written thereto.

Conventionally, the drain voltages applied to the memory cell during the reading procedure and the verification procedure are the same, which makes the leakage current during the verification procedure too large. In this invention, the drain voltage during the verification procedure is raised to be 2.5 volts, and the isolation voltage is set to be 2.4 volts. At this time, the voltage Vgs of the gate to the source of the memory cell M(k,i) is Vg-Viso-Vt-Vb, wherein Vt is the threshold voltage (assumed to be 1.2 volts) of the non-programmed memory cell M(k,i), and Vb (about 0.6 volts) is the voltage produced by the body effect, so the voltage Vgs is about 0. Thus, no leakage current is produced, and the precision of the verification method may be ensured accordingly.

In the method for verifying the flash memory according to the embodiment of the invention, the higher drain voltage and isolation voltage are utilized to reduce the leakage current, thereby enhancing the precision of verification. In addition, the time for executing the verification method is very short, so the risen drain voltage cannot influence the data stored in the memory cell.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for verifying a programmed flash memory, wherein when a memory cell of the flash memory is read, a voltage applied to a drain of the memory cell is a read drain voltage, the method comprising:

enabling a word line and applying a verification gate voltage;

enabling a first bit line, which is electrically connected to the drain of the memory cell, and applying a verification drain voltage, which is higher than the read drain voltage, to the first bit line;

enabling and grounding a second bit line;

enabling a third bit line and applying a verification isolation voltage;

sensing a drain current on the first bit line, wherein the drain current flows through the first bit line, the memory cell and the second bit line; and judging whether or not the memory cell is successfully programmed according to the drain current.

2. The method according to claim 1, wherein the read drain voltage is substantially 1.6 volts.

3. The method according to claim 1, wherein the verification drain voltage is substantially 2.5 volts.

4. The method according to claim 1, wherein the verification isolation voltage is substantially 2.5 volts.

5. The method according to claim 1, wherein the verification gate voltage is substantially 4.2 volts.

6. The method according to claim 1, wherein the flash memory is a virtual ground array.

* * * * *